(12) United States Patent
Liu et al.

(10) Patent No.: US 6,369,732 B1
(45) Date of Patent: Apr. 9, 2002

(54) LOW VOLTAGE FULLY DIFFERENTIAL ANALOG-TO-DIGITAL CONVERTER

(75) Inventors: Hung-Chih Liu; Wei-Chen Shen, both of Hsin Chu (TW)

(73) Assignee: Silicon Integrated Systems Corp., Hsin-chu (TW)

( * ) Notice: Subject to any disclaimer, the term of this patent is extended or adjusted under 35 U.S.C. 154(b) by 0 days.

(21) Appl. No.: 09/726,331

(22) Filed: Dec. 1, 2000

(30) Foreign Application Priority Data

Sep. 26, 2000 (TW) ........................ 89119909 A

(51) Int. Cl.[7] ............................. H03M 1/36; H03M 3/00
(52) U.S. Cl. ........................................ 341/143; 341/159
(58) Field of Search ................................. 341/120, 156, 341/143, 155, 159, 160, 161; 330/258, 253

(56) References Cited

U.S. PATENT DOCUMENTS

| | | |
|---|---|---|
| 5,175,550 A | 12/1992 | Kattmann et al. |
| 5,589,831 A * | 12/1996 | Knee .......................... 341/159 |
| 5,742,248 A * | 4/1998 | Vorenkamp et al. ........ 341/156 |
| 5,835,048 A | 11/1998 | Bult |
| 6,014,097 A * | 1/2000 | Brandt ........................ 341/156 |

* cited by examiner

Primary Examiner—Patrick Wamsley

(57) ABSTRACT

The present invention is to provide a low voltage fully differential analog-to-digital converter. The converter consists of an input stage including a plurality of pre-amplifier differential input cells for producing pre-amplified signals, a successive processing stage for receiving pre-amplified signals from the input stages, and a decoder for output converted signals according to the signals from the successive processing stage. Each differential input cell includes first and second differential pre-amplifiers, a bias impedance, and an averaging impedance branch. The first and second differential pre-amplifiers include two transistors, respectively, and differentially amplify a set of input signals. One terminal of the bias impedance is connected to a high supplied voltage while the other terminal of the bias impedance is connected to the first and second output terminals through respective pieces of load bearing impedance in order to adjust output voltages of first and second output terminals. Moreover, the averaging impedance branch includes an impedance connecting the second output terminal and the first output terminal of an adjacent differential input cell and another impedance connecting the other end of the bias impedance and the other end of the bias impedance of the adjacent differential input cell.

4 Claims, 7 Drawing Sheets

LOW VOLTAGE FULLY DIFFERENTIAL ANALOG-TO-DIGITAL CONVERTER

BACKGROUND OF THE INVENTION

A. Field of the Invention

This present invention relates to an analog-to-digital converter and, in particular, to a low voltage fully differential analog-to-digital converter.

B. Description of the Related Art

FIG. 1 shows a schematic structure diagram of a conventional flash type analog-to-digital converter (hereinafter referred as ADC). The ADC 110 consists of an input stage branch 111, a comparison stage branch 112, and a decoding branch 113. The comparison stage branch 112 has a plurality of comparators 1121 and each comparator 1121 is used to compare two voltages at two output terminals Vo1 and Vo2 of respective input cell 100 of the input stage branch 111. And, the output of the comparator 1121 is logic 1 when Vo1 is higher than Vo2 while the output of the comparator 1121 is logic 0 when Vo1 is lower than Vo2. The decoding branch 113 is to convert the signals from the comparators 1121 of the comparison stage branch 112 into binary digital signals.

FIG. 2(A) shows a type of the input stage branch used in the ADC of FIG. 1 disclosed in the invention of U.S. Pat. No. 5,175,550. The input stage branch 111 consists of a plurality of input cells 100 connected by cascade. Each input cell 100 includes a differential pre-amplifier 101, two pieces of load bearing impedance 102 connected to two output terminals of the differential pre-amplifier 101, and an averaging impedance branch 103 connected to two output terminals of every input cell 100. By the use of the averaging impedance branch 103 the characteristic difference between every input cell 100 can be equalized. As shown in FIG. 1, the input terminal Vin1 of the differential pre-amplifier 101 is connected to the analog input signals while the other input terminal Vin2 of the differential pre-amplifier 101 is connected to a partial voltage point of a reference voltage provided by the progressive resistors branch 104. The progressive resistors branch 104 consists of progressive resistors connected in a network between a terminal Vref_H providing a reference voltage and a terminal Vref_L providing a low potential such as ground. When the voltage of Vin1 is higher than that of Vin2, the first output terminal Vo1 of the differential pre-amplifier 101 is at high level while its second output terminal Vo2 is at low level in order to send a differential signal to the comparator 1121.

FIG. 2(B) shows another type of input stage branch used in the ADC of FIG. 1 disclosed in the invention of U.S. Pat. No. 5,835,048. The structure of an input cell 100' is similar to that of the input cell 100 in FIG. 2 (A) except that a passive element of load bearing impedance 102 of input cell 100 has been replaced by an active element of a current source 102'.

However, as shown in FIG. 3 regarding the first type of input cell in FIG. 2 (A), when a supplied voltage is+3.3V, an output voltage of the differential pre-amplifier is very close to the supplied voltage 3.3V because the load 102 is a passive element such as resistors. When a successive processing stage is an active element and a supplied voltage is 3.3V, an output voltage resulted from the supplied voltage will be over of the range of operational voltage of a regular active element. Therefore, the following elements, such as folding type or interpolation type comparators, connected to the input stage branch 111 from behind must be limited to be a passive load. Thus, the design of successive processing stage is restricted and consequently its gain is limited.

With regard to the second type of input cell in FIG. 2(B), the common mode voltage output from a differential pre-amplifier can be lowered by means of a current source loading. However, because the current source is made of transistors, the range of input voltage of analog input signals will be limited due to the critical voltage $V_{TH}$ (about 1V) of transistors. And, such input cell can not operate under a condition of lower supplied voltage (such as 2.5V). In the mean time, a relatively higher capacitance of such input cell limits its responding speed. Furthermore, such design is relatively more complicated while occupying more area of chip because of the replacement of a loading impedance with a current source.

SUMMARY OF THE INVENTION

In view of the aforesaid disadvantages, one of objects of the present invention is to provide a low voltage fully differential analog-to-digital converter which can be operational under a condition of lower supplied voltage.

Another object of the present invention is to provide a low voltage fully differential analog-to-digital converter which can be operational within a range of higher frequency. And, a successive processing stage of an active element can be connected to an input stage of the low voltage fully differential analog-to-digital converter from behind.

A low voltage fully differential analog-to-digital converter according to the present invention consists of an input stage including a plurality of differential input cells for producing pre-output signals and successive processing stages for receiving pre-output signals from input stages. And, the low voltage fully differential analog-to-digital converter according to the present invention further consists of a decoder for receiving post-output signals from successive processing stages. Each differential input cell includes first and second differential pre-amplifiers, a bias impedance, and an averaging impedance branch.

The first differential pre-amplifier includes two transistors whose sources are connected together and connected with a low supplied voltage through a current source, and whose drains are respectively connected to first and second output terminals. The gates of these two transistors are respectively connected to a first input signal and a partial voltage point of a reference voltage branch. The second differential pre-amplifier includes two transistors whose sources are connected together and connected with a low supplied voltage through a current source, and whose drains are respectively connected to first and second output terminals. The gates of these two transistors are respectively connected to a second input signal and a partial voltage point of a reference voltage branch.

One end of the bias impedance is connected to a high supplied voltage while the other end of the bias impedance is connected to first and second output terminals through two respective pieces of load bearing impedance. Therefore, the offset of output voltages of first and second output terminals can be adjusted thereby. An averaging impedance branch consists of two sets of impedance that first set of impedance connects the second output terminal of the differential input cell and the first output terminal of an adjacent differential input cell. And, second set of impedance connects the other end of the bias impedance of the differential input cell and the other end of the bias impedance of an adjacent differential input cell.

The mentioned objects, various other objects, advantages, and features of the present invention will be more fully understood from the following detailed description of the preferred aspect of the invention when considered in connection with the accompanying drawings.

BRIEF DESCRIPTION OF THE DRAWINGS

These and other objects and advantages of the present invention will become apparent by reference to the following description and accompanying drawings wherein.

DETAIL DESCRIPTION OF THE INVENTION

The preferred aspects of embodiments of a low voltage fully differential analog-to-digital converter according to the present invention is illustrated with reference of accompanying drawings as follows.

Figure 1:
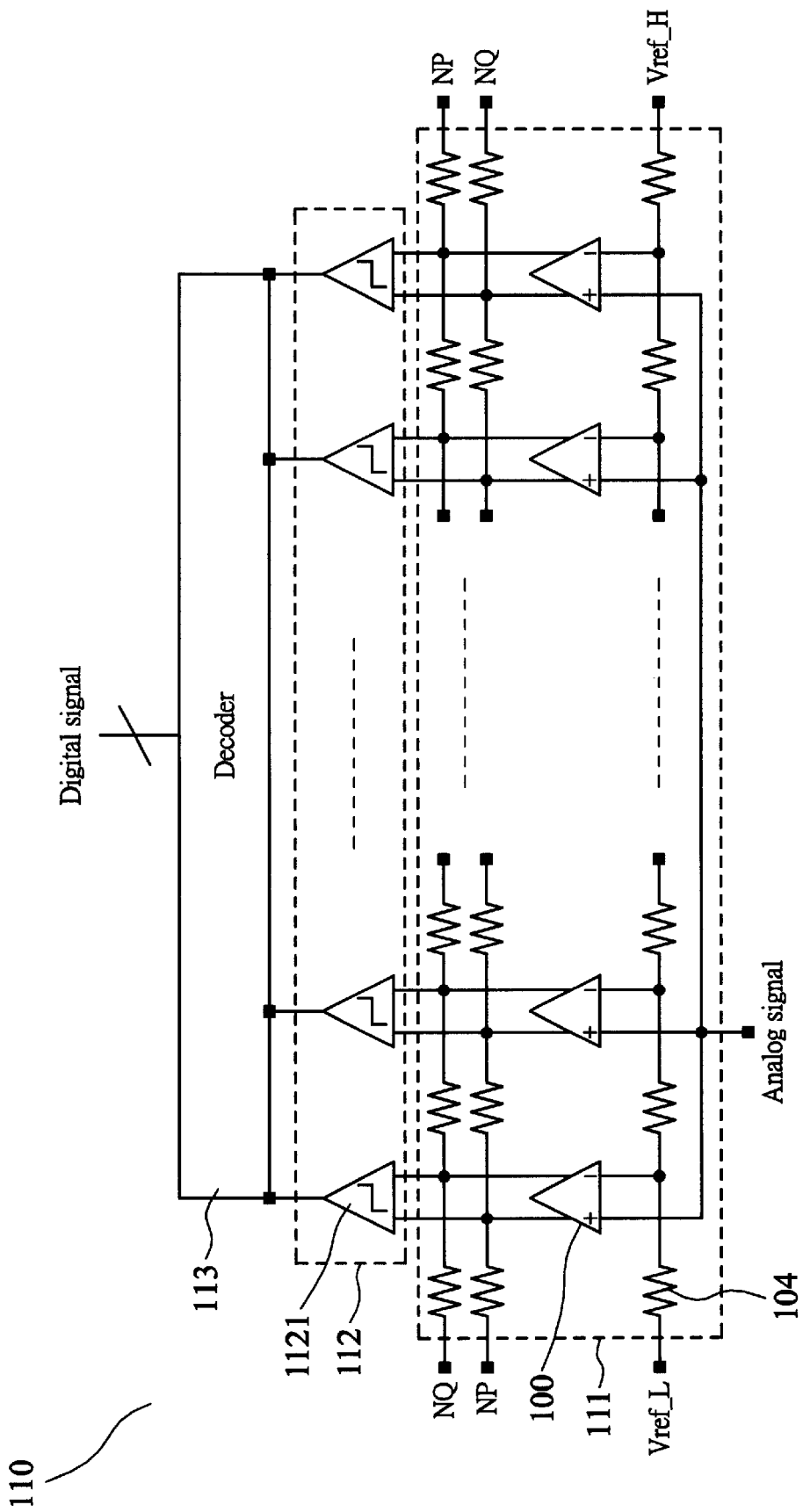
FIG. 1 is a schematic structure diagram of a flash type analog-to-digital converter of the prior art.
Figure 2A:
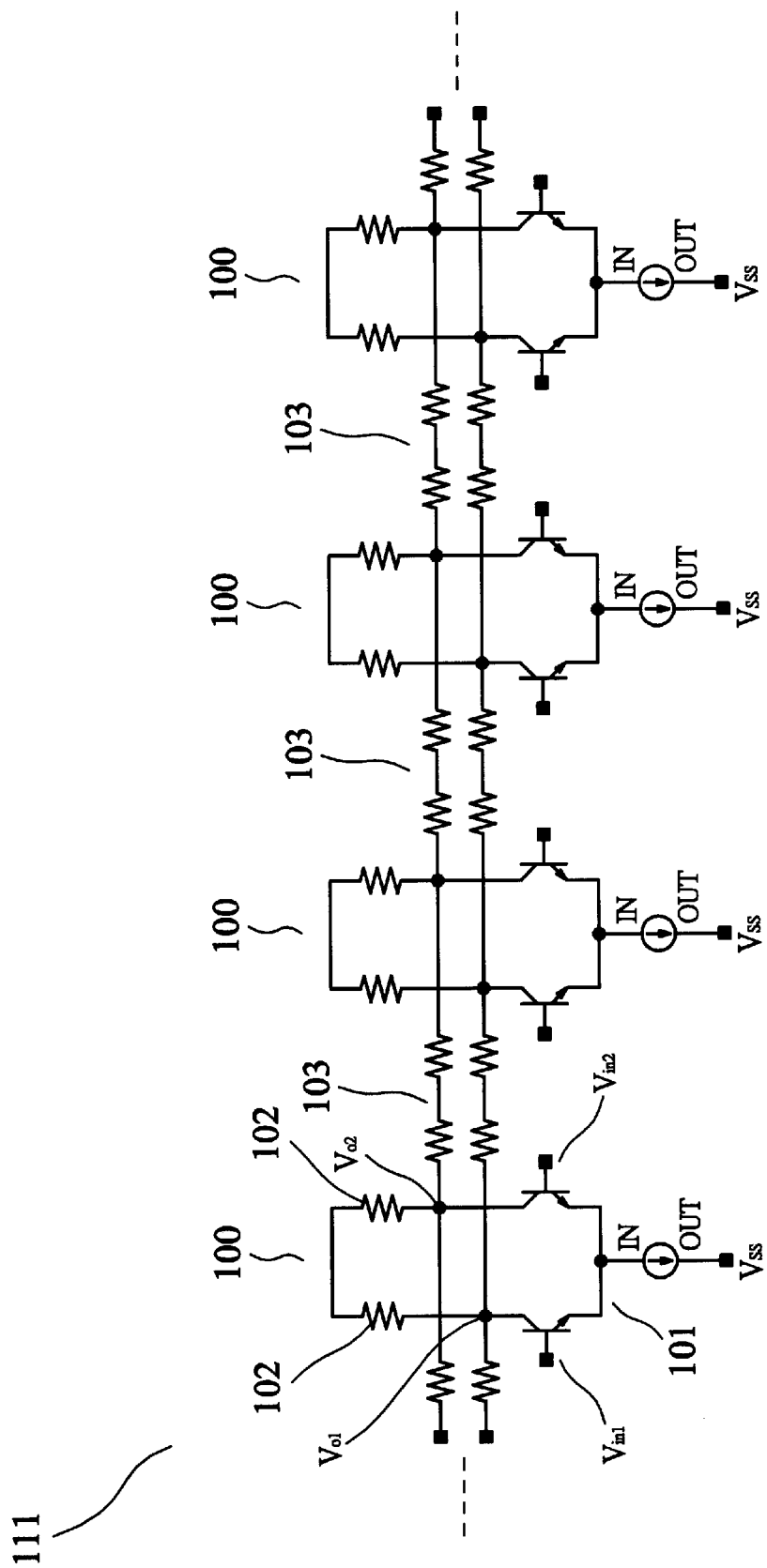
FIG. 2(A) is a circuit diagram of a conventional input stage employed by the analog-to-digital converter of the prior art in FIG. 1.
Figure 2B:
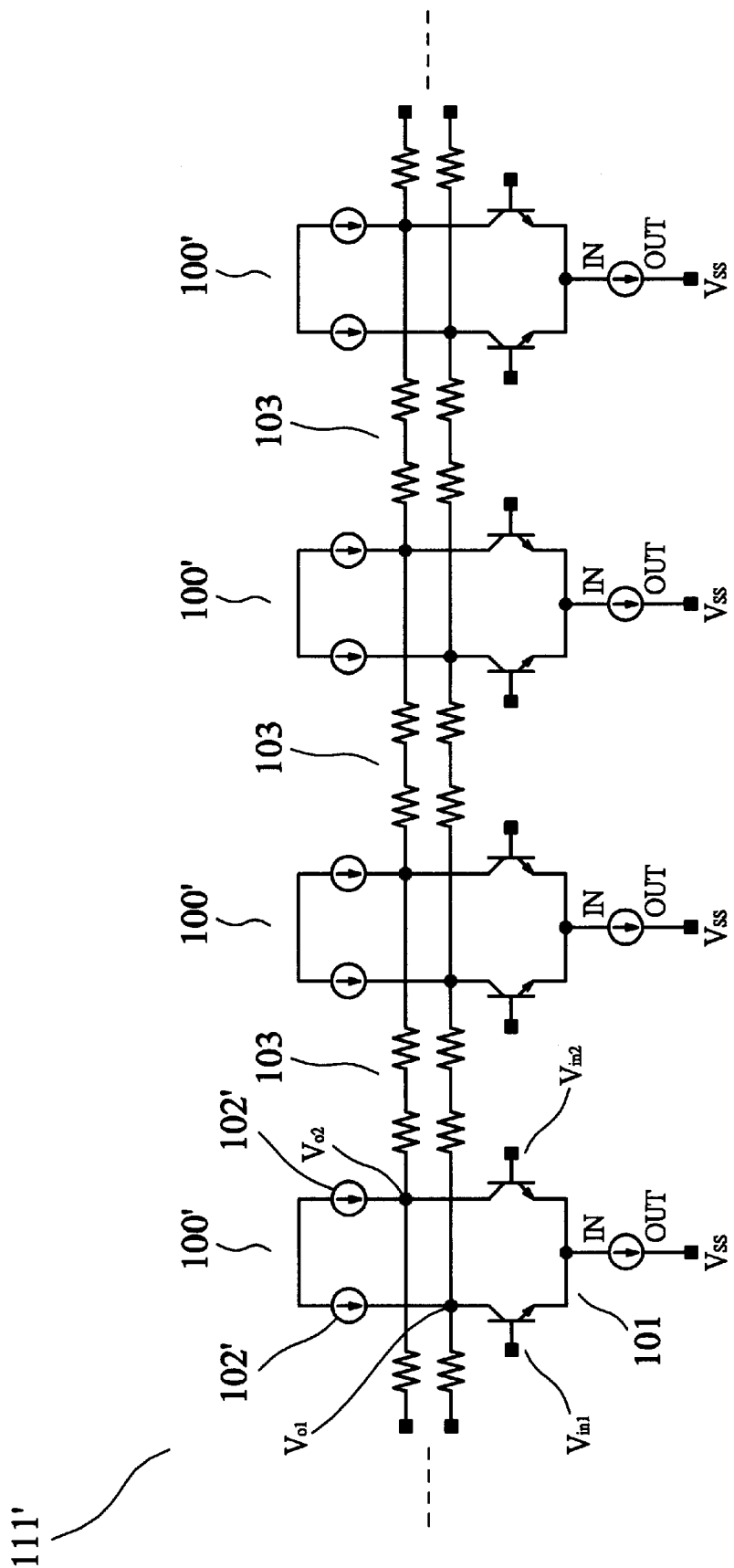
FIG. 2(B) is a circuit diagram of another kind of conventional input stage employed by the analog-to-digital converter of the prior art in FIG. 1.
Figure 3:
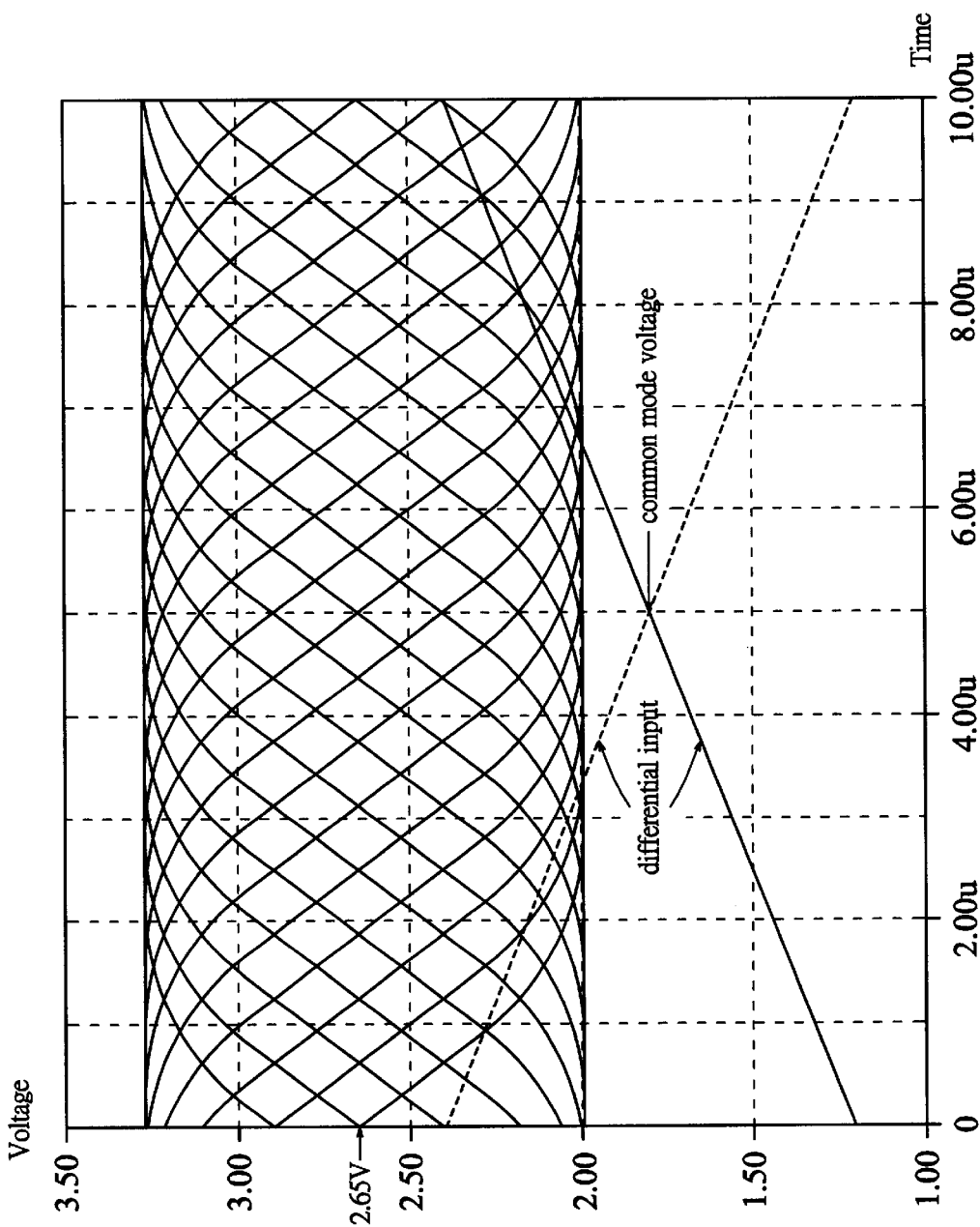
FIG. 3 shows a range of output voltage of the input stage employed by the analog-to-digital converter shown in FIG. 2(A).
Figure 4:
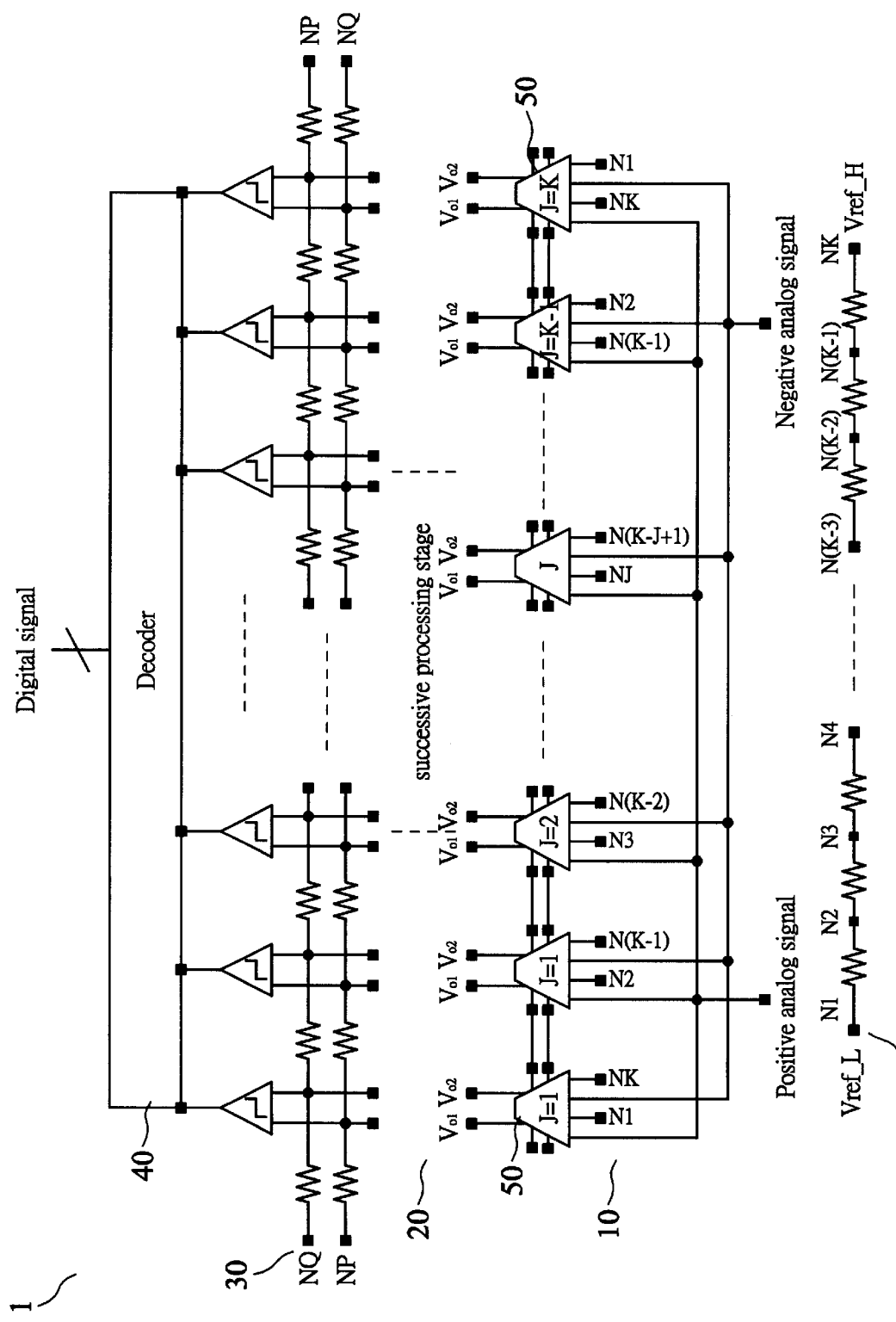
FIG. 4 is a schematic structure diagram of a flash type analog-to-digital converter according to the present invention.

FIG. 4 shows a schematic structure diagram of one aspect of embodiments of a flash type low voltage fully differential analog-to-digital converter (hereinafter referred as ADC) according to the present invention. The ADC 1 consists of an input stage 10, a successive processing stage 20, a comparator 30, and a decoder 40 wherein both the comparator 30 and the decoder 40 are as same as that are used by the prior art. Therefore, detailed illustration of them is spared herewith. The successive processing stage 20 is a processing unit frequently used by the persons skilled in the art so that its illustration is also spared herewith. The following description only illustrates the input stage 10 of the present invention in detail.

Figure 5:
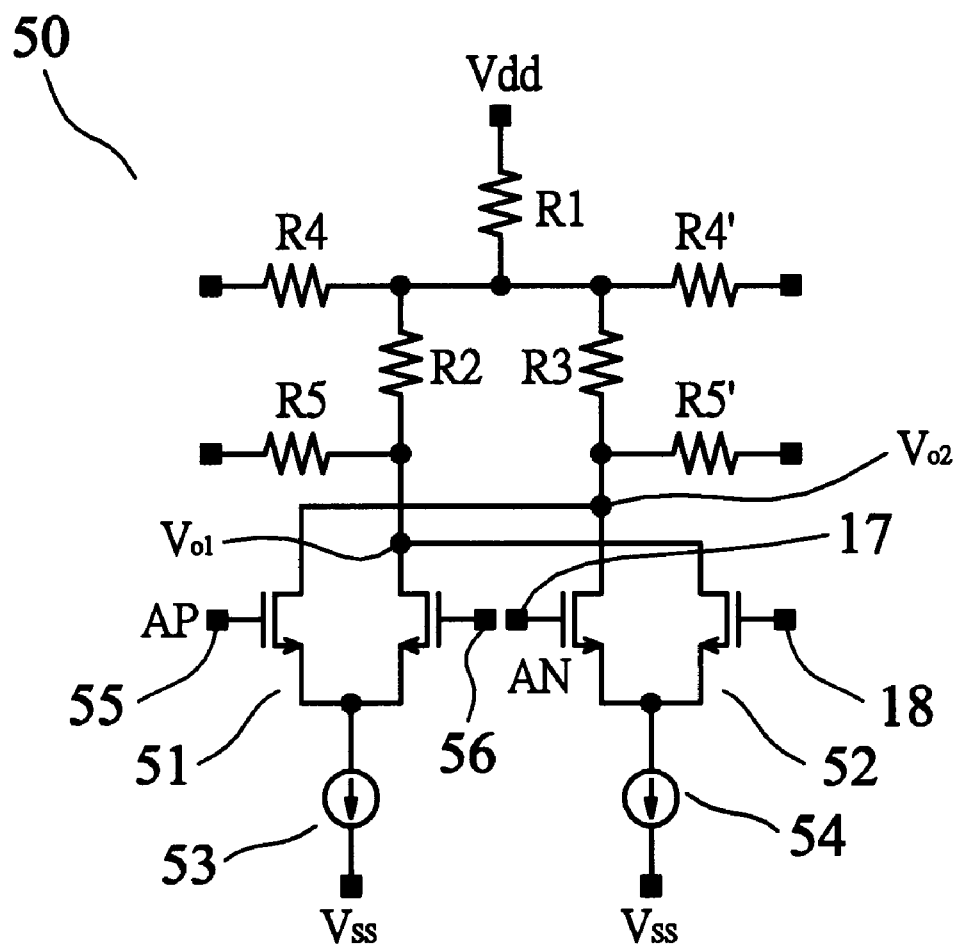
FIG. 5 is a circuit diagram of an input stage employed by the analog-to-digital converter of the present invention in FIG. 4.

FIG. 5 shows the circuit diagram of each differential input cell 50 of the input stage 10 of the present invention. The input stage 10 consists of a plurality of differential input cells 50 and an impedance branch of the reference voltage 60 (referring FIG. 4). Referring to FIG. 5, the differential input cell 50 includes two differential pre-amplifiers 51, 52, a bias impedance R1, two pieces of load bearing impedance R2, R3, and an averaging impedance branch including R4, R4', R5, and R5'. Each source of the transistors of the differential pre-amplifiers 51, 52 is respectively connected to constant current sources 53, 54, respectively, in order to provide an operational environment for the differential pre-amplifiers 51, 52. Each of two drains of the differential pre-amplifiers 51, 52 of the input cell 50 is respectively connected to a first output terminal Vo1 and a second output terminal Vo2. The output terminals Vo1 and Vo2 are connected to the bias impedance R1 through the load bearing impedance R2 and R3 respectively, while the other end of the bias impedance R1 is connected to the supplied voltage $V_{dd}$. The differential input cells 50 uses the averaging impedance branch of R4, R4', R5 and R5' to connect other adjacent differential input cells 50 to improve the homogeneity of element characteristic between each input cell 50. Although every differential input cell 50 has four averaging impedance R4, R4', R5 and R5' in this embodiment, the R4 and R5 can combine with R4' and R5' of an adjacent differential input cell 50 to form a single impedance.

A first input terminal AP (gate of a transistor) of the first differential pre-amplifier 51 of every differential input cell 50 is connected to a positive analog input voltage $V_{AP}$, while a drain of that transistor is connected to a second output terminal Vo2. And, a second input terminal (gate of a transistor) of the first differential pre-amplifier 51 is connected to a partial voltage point of the progressive resistors branch 60 while a drain of that transistor is connected to a first output terminal Vo1. Besides, a first input terminal AN (gate of a transistor) of the second differential pre-amplifier 52 of every differential input cell 50 is connected to a negative analog input voltage $V_{AN}$ while a drain of that transistor is connected to a second output terminal Vo2. And, a second input terminal (gate of a transistor) of that second differential pre-amplifier 52 is connected to a partial voltage point of the progressive resistors branch 60 while a drain of that transistor is connected to a first output terminal Vo1.

Besides, the positive analog input voltage $V_{AP}$ and the negative analog input voltage $V_{AN}$ usually are in a form of voltage signals with respect to an common mode voltage of input signal. The common mode voltage is the average of sum of both the positive reference voltage Vref_H and the negative reference voltage Vref_L, namely, (Vref_H+ Vref_L)/ 2. For example, if the positive reference voltage Vref_H is 2.4 V and the negative reference voltage Vref_L is 1.2 V, the common mode voltage is 1.8 V. Under this condition, if the positive analog input voltage $V_{AP}$ is 2.0 V, the negative analog input voltage $V_{AN}$ is 1.6 V.

Furthermore, referring to FIG. 4, if an ADC 1 has K pieces of differential input cell 50, then the progressive resistors branch 60 may be an assembly of K–1 pieces of resistors connected in series, wherein every resistor has same resistance. And, one terminal of the progressive resistors branch 60 is connected to the negative reference voltage Vref_L while the other terminal of the progressive resistors branch 60 is connected to the positive reference voltage Vref_H. Therefore, the progressive resistors branch 60 has K partial voltage points N1~NK arranged from low voltage terminal to high voltage terminal. Thus, the reference voltage of the first differential pre-amplifier 51 of number J differential input cell 50 is connected to the partial voltage point NJ while the reference voltage of the second differential pre-amplifier 52 of number J differential input cell 50 is connected to the partial voltage point N(K-J+1). For example, the reference voltage of the first differential pre-amplifier 51 of number 10 differential input cell 50 is connected to the partial voltage point N10 while the reference voltage of the second differential pre-amplifier 52 of number 10 differential input cell 50 is connected to the partial voltage point N(K–9).

Figure 6:
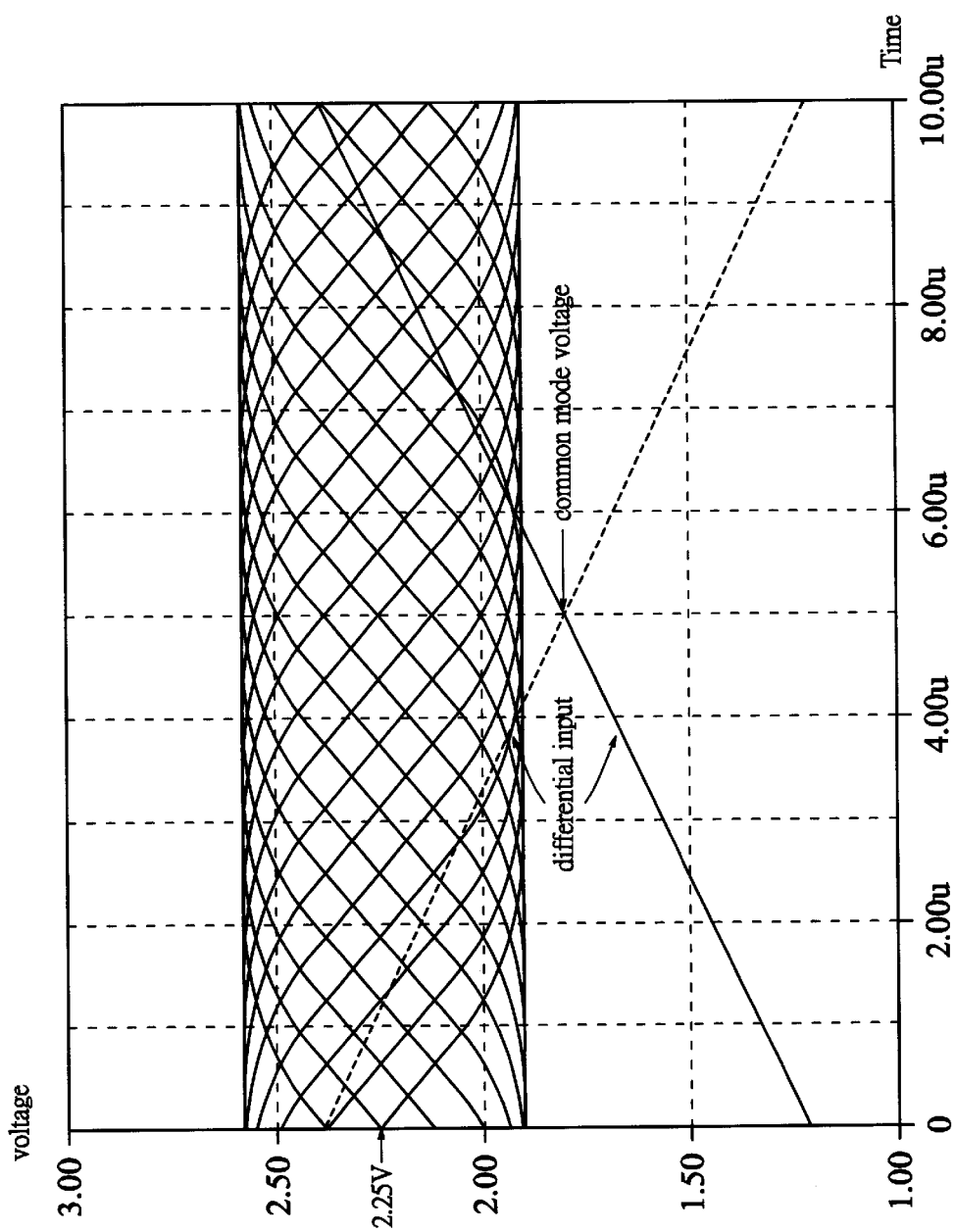
FIG. 6 shows a range of output voltage of an input stage after employing a bias impedance according to the present invention.

Moreover, FIG. 5 further discloses the principle of function of differential input cell 50 according to the present invention. When one set of analog input signal $V_{AP}$ and $V_{AN}$ is fed into differential pre-amplifiers 51, 52 of an differential input cell 50, the differential pre-amplifiers 51, 52 send signals through first and second output terminal Vo1 and Vo2 according to different voltages at respective partial voltage points. Then, as shown in FIG. 6, the common mode voltage of the first output terminal Vo1 and second output terminal Vo2 is adjusted downward due to the effect of a bias impedance R1. Particularly, the output voltages of the first output terminal Vo1 and second output terminal Vo2 are limited within the range of 1.9V~2.6 V. Thus, the output voltages of the first output terminal Vo1 and second output terminal Vo2 do not exceed the operational voltage range of an active element used as a successive processing stage. Besides, because passive elements are employed as load bearing impedance and bias impedance in the present invention, a critical voltage $V_{TH}$ of current source would not be produced while $V_{TH}$ would be produced when an active element is employed. Therefore, the operational voltage can be decreased down to 2.5 V or even lower voltage.

Furthermore, two differential pre-amplifiers 51, 52 are employed in every differential input cell 50 according to the present invention in order to perform the differential amplification on the positive analog input voltage $V_{AP}$ and negative analog input voltage $V_{AN}$ respectively. In comparison to the prior art that only employs one differential pre-amplifier, the analytical characteristic of an input stage can be further enhanced while the interference of noise can be reduced at the same time according to the present invention.

Because two differential pre-amplifiers are employed in a flash type analog-to-digital converter according to the present invention in order to compare the positive and negative analog input signals being complementary to each other, the analytical characteristic of input signals can be enhanced thereby. Furthermore, because a bias impedance is employed in order to adjust the DC level of output terminals of an input stage branch in the flash type analog-to-digital converter according to the present invention, an active-load element can be connected from behind as a process element of successive processing stage. In addition, because a passive-load element is employed as a load bearing impedance in the flash type analog-to-digital converter according to the present invention, the input capacitance is reduced and therefore the responding speed is enhanced.

While the structure of a flash type analog-to-digital converter according to the present invention has been described with reference to a preferred aspect of embodiments mentioned above, it should not be considered as a limitation of the scope of the present invention. Various possible modifications and alterations could be performed by persons who are skilled in the art without departing from the principles of the present invention. It is intended that the following claims define the present invention and that the structure within the scope of these claims and their equivalents be covered thereby.

What is claimed is:

1. A low voltage fully differential analog-to-digital converter including an input stage provided with a plurality of differential input cells for producing pre-amplified signals, a successive processing unit for receiving said pre-amplified signals from said input stage, and a decoding output stage for receiving signals from said successive processing stage, wherein each said differential input cell comprising:

a first differential amplifier having two transistors, the sources of said transistors connected together and connected with a low supplied voltage through a current source, the drains of said two transistors connected to a first output terminal and a second output terminal, respectively, and the gates of said resistors connected to a first input terminal and a reference voltage branch, respectively;

a second differential amplifier having two transistors, the sources of said transistors connected together and connected with a low supplied voltage through a current source, the drains of said two transistors connected to said first output terminal and said second output terminal, respectively, and the gates of said resistors connected to a second input terminal and said reference voltage branch, respectively;

a bias impedance having a first terminal and a second terminal, said first terminal connected to a high supplied voltage and said second terminal connected to said first and said second output terminals of said differential input cell through respective pieces of load bearing impedance to adjust output voltages of said first and second output terminals; and an impedance branch having a first impedance connecting said second output terminal of said differential input cell and a first output terminal of an adjacent differential input cell, and having a second impedance connecting said second terminal of said bias impedance of said differential input cell and a second terminal of a bias impedance of said adjacent differential input cell.

2. A low voltage fully differential analog-to-digital converter of claim 1, wherein said successive processing stage is a passive loading element.

3. A low voltage fully differential analog-to-digital converter of claim 1, wherein said successive processing stage is an active loading element.

4. A low voltage fully differential analog-to-digital converter of claim 1, wherein said reference voltage branch includes a plurality of resistors connected in series wherein each resistor has same resistance.

* * * * *